United States Patent
Xie et al.

(10) Patent No.: US 11,544,164 B2
(45) Date of Patent: Jan. 3, 2023

(54) SIGNAL ANALYSIS METHOD AND TEST SYSTEM

(71) Applicant: Rohde & Schwarz GmbH & Co. KG, Munich (DE)

(72) Inventors: Feng Xie, Munich (DE); Taro Eichler, Munich (DE)

(73) Assignee: Rohde & Schwarz GmbH & Co. KG, Munich (DE)

( * ) Notice: Subject to any disclaimer, the term of this patent is extended or adjusted under 35 U.S.C. 154(b) by 158 days.

(21) Appl. No.: 17/160,121

(22) Filed: Jan. 27, 2021

(65) Prior Publication Data

US 2021/0232470 A1  Jul. 29, 2021

(30) Foreign Application Priority Data

Jan. 28, 2020 (EP) .................................. 20154120

(51) Int. Cl.
| | |
|---|---|
| *H04B 17/17* | (2015.01) |
| *G01R 31/28* | (2006.01) |
| *G01R 31/00* | (2006.01) |
| *G06N 20/00* | (2019.01) |
| *G06F 11/22* | (2006.01) |
| *G06F 1/28* | (2006.01) |

(52) U.S. Cl.
CPC ............ *G06F 11/2257* (2013.01); *G06F 1/28* (2013.01); *G06N 20/00* (2019.01); *H04B 17/17* (2015.01)

(58) Field of Classification Search
CPC ....... H04B 17/17; G06F 11/2257; G06F 1/28; G06N 20/00; G01R 31/28; G01R 31/00
See application file for complete search history.

(56) References Cited

U.S. PATENT DOCUMENTS

| 5,115,672 A | 5/1992 | McShane et al. |
| 5,945,948 A | 8/1999 | Buford et al. |

(Continued)

FOREIGN PATENT DOCUMENTS

EP  2772862 A1  3/2014

OTHER PUBLICATIONS

Barragan, M. J., et al., Alternate Test of LNAs Through Ensemble Learning of On-Chip Digital Envelope Signatures,: Springer Science+ Business Media, LLC: J Electron Test 27: 277-288, Jan. 6, 2011.

(Continued)

*Primary Examiner* — Dominic E Rego
(74) *Attorney, Agent, or Firm* — Christensen O'Connor Johnson Kindness PLLC

(57) ABSTRACT

A signal analysis method of analyzing a performance of a device under test is described. A digitized input signal is obtained, wherein the digitized input signal is associated with the device under test. At least one characteristic quantity is determined via an artificial intelligence circuit. The artificial intelligence circuit includes at least one computing parameter. The at least one characteristic quantity is determined based on the digitized input signal and based on the at least one computing parameter. The at least one characteristic quantity is indicative of at least one performance property of the device under test. Further, a test system for analyzing a performance of a device under test as well as a computer program or program product are described.

19 Claims, 2 Drawing Sheets

(56) References Cited

U.S. PATENT DOCUMENTS

| | | | | |
|---|---|---|---|---|
| 6,175,939 | B1* | 1/2001 | Dinteman | G01R 31/31924 |
| | | | | 714/724 |
| 6,218,910 | B1* | 4/2001 | Miller | G01R 1/073 |
| | | | | 333/33 |
| 6,281,699 | B1* | 8/2001 | Bishop | G01R 31/31932 |
| | | | | 324/750.01 |
| 6,505,137 | B1* | 1/2003 | Evans, Jr. | G06F 11/26 |
| | | | | 714/E11.159 |
| 7,890,821 | B2* | 2/2011 | Music | H04W 24/06 |
| | | | | 370/242 |
| 9,484,942 | B1* | 11/2016 | Peschke | H03M 1/188 |
| 11,320,480 | B1* | 5/2022 | Gaoiran | G01R 31/2849 |
| 2002/0094820 | A1 | 7/2002 | Keranen et al. | |
| 2004/0180671 | A1 | 9/2004 | Spain, Jr. | |
| 2005/0182588 | A1* | 8/2005 | Chenoweth | G01R 31/31907 |
| | | | | 702/118 |
| 2005/0255865 | A1 | 11/2005 | Sillasto et al. | |
| 2006/0047461 | A1* | 3/2006 | Sivaram | H04L 43/50 |
| | | | | 702/120 |
| 2006/0047463 | A1* | 3/2006 | Sivaram | H04L 43/50 |
| | | | | 702/120 |
| 2006/0236327 | A1* | 10/2006 | Lu | G06F 11/3664 |
| | | | | 714/E11.207 |
| 2007/0071080 | A1* | 3/2007 | Sartschev | G01R 31/31932 |
| | | | | 375/224 |
| 2009/0033528 | A1* | 2/2009 | Kimura | H03M 1/109 |
| | | | | 341/120 |
| 2009/0039897 | A1* | 2/2009 | Fong | G01R 31/3167 |
| | | | | 324/537 |
| 2010/0002819 | A1* | 1/2010 | Conner | H04L 7/033 |
| | | | | 375/355 |
| 2010/0083049 | A1* | 4/2010 | Miki | G06F 11/0715 |
| | | | | 714/E11.212 |
| 2011/0109321 | A1* | 5/2011 | Kawabata | G01R 31/3167 |
| | | | | 324/555 |
| 2013/0234723 | A1* | 9/2013 | Behrens | G01R 31/3191 |
| | | | | 324/537 |
| 2015/0051863 | A1* | 2/2015 | Tsuchida | G06F 11/2294 |
| | | | | 702/123 |
| 2015/0067422 | A1 | 3/2015 | Hamilton | |
| 2015/0091594 | A1 | 4/2015 | Hamilton | |
| 2016/0165226 | A1* | 6/2016 | Djurdjevic | H04N 21/442 |
| | | | | 348/188 |
| 2018/0026737 | A1 | 1/2018 | Kucheravy | |
| 2018/0247256 | A1* | 8/2018 | Takigawa | G06N 20/00 |
| 2018/0331928 | A1* | 11/2018 | Dave | G06F 9/5072 |
| 2019/0246299 | A1 | 8/2019 | Roman et al. | |
| 2019/0356397 | A1* | 11/2019 | DaSilva | H04B 17/17 |
| 2020/0355739 | A1* | 11/2020 | Peterson | G01R 31/31712 |

OTHER PUBLICATIONS

Guo, S., et al., "Integrating Laplacian Eigenmaps Feature Space Conversion into Deep Neural Network for Equipment Condition Assessment," Automatic Control and Computer Sciences 52(6): 465-475, May 29, 2018.

Tian, Y., et al., "A Review of Fault Diagnosis for Traction Induction Motor," Proceedings of the 37th Chinese Control Conference, Wuhan, China; Jul. 25-27, 2018, pp. 5763-5768.

Tun, P. P., et al., "Brushless Synchronous Generator Turn-to-Turn Short Circuit Fault Detection Using Multilayer Neural Network," 2018 Asian Conference on Energy, Power and Transportation Electrification (ACEPT), 2018, pp. 1-8.

\* cited by examiner

SIGNAL ANALYSIS METHOD AND TEST SYSTEM

FIELD OF THE DISCLOSURE

Embodiments of the present disclosure generally relate to a signal analysis method of analyzing a performance of a device under test. Embodiments of the present disclosure further relate to a test system for analyzing a performance of a device under test as well as to a computer program.

BACKGROUND

In the state of the art, RF devices used for wireless transmission of information and data, for example mobile communication devices, are typically tested by a separately formed test and measurement device during or after production of the RF device.

The device under test may transmit a test signal for testing purposes wherein the test signal is received by the test and measurement device for analyzing purposes. However, such a testing system is usually complex, and a highly trained operator is necessary in order to obtain correct testing results.

Accordingly, there is a need for a signal analysis method as well as a testing system that are easier to operate.

SUMMARY

Embodiments of the present disclosure provide a signal analysis method of analyzing a performance of a device under test. In an embodiment, the method comprises the following steps: A digitized input signal is obtained, wherein the digitized input signal is associated with the device under test. At least one characteristic quantity is determined via an artificial intelligence module composed of, for example, one or more circuits. The artificial intelligence module comprises at least one computing parameter. The at least one characteristic quantity is determined based on the digitized input signal and based on the at least one computing parameter. The at least one characteristic quantity is indicative of at least one performance property of the device under test.

The term "the digitized input signal is associated with the device under test" comprises both the possibility that the digitized input signal is a digitized version of the output signal of the device under test as well as the possibility that the output signal of the device under test is received via one or more antennas and that the received signal is digitized, for example by a test system for analyzing a performance of the device under test.

The at least one characteristic quantity may comprise information on certain aspects of the performance of the device under test and/or about particular faults and errors in the performance of the device under test.

The at least one characteristic quantity may have any suitable form. For example, it may comprise a scalar, a vector, a matrix and/or a tensor.

In other words, the at least one characteristic quantity, i.e. information on the performance of the device under test, is determined in a fully automatic way by the artificial intelligence module based directly on the digitized input signal. No further processing of the digitized input signal is required, which may be complicated as parameters and operational modes of the corresponding processing devices would have to be set, which usually can only be done by an expert in the field, yielding a restricted user-friendliness.

Thus, a user friendly and easy way of testing the performance of the device under test is provided.

According to an aspect of the present disclosure, the device under test is categorized into at least one of at least two different performance categories based on the at least one characteristic quantity determined. For example, the device under test may be categorized into the category "test passed" or "test not passed". Of course, there may be more different categories, for example categories associated with particular errors or defects in the performance of the device under test. This way, the errors and defects can be comprehended in an easier way by a user, and appropriate consequences for the production of the device under test may be taken.

According to another aspect of the present disclosure, a control unit is provided, wherein the control unit includes one or more circuits configured to control the device under test to enter a predetermined operation mode and/or a sequence of predetermined operation modes, namely at least one predetermined operation mode. The predetermined operation mode corresponds to a certain sending mode of the device under test. Thus, the device under test generates an electromagnetic signal in a predetermined way in the predetermined operation mode or in the sequence of predetermined operation modes.

The predetermined operation mode or rather the sequence of predetermined operation modes may be associated with a predefined test procedure that is suitable for the particular device under test. The predefined test procedure may be a normed test procedure.

In an embodiment of the present disclosure, the control unit controls the artificial intelligence module to adapt the at least one computing parameter based on the predetermined operation mode of the device under test. In other words, the at least one computing parameter is adapted to suit the particular operation mode of the device under test and/or the particular sequence of operation modes of the device under test. The at least one computing parameter is adapted fully automatically, without a need of manual intervention by a human operator.

In other words, the control unit provides a communication between the artificial intelligence module and the device under test such that the computing parameter can be adapted in dependency of the current or intended operation mode of the device under test. This simplifies and improves the determination of the characteristic quantity by the artificial intelligence module significantly.

According to a further embodiment of the present disclosure, a power supply unit provides the device under test with power. The power supply unit includes one or more circuits for providing usage information on a power consumption of the device under test, a current consumption of the device under test and/or a voltage applied to the device under test, and wherein the usage information is forwarded to the artificial intelligence module. Thus, additional information on performance properties of the device under test is provided, which may be utilized by the artificial intelligence module.

In some embodiments, the artificial intelligence module determines the at least one characteristic parameter based on the usage information. Accordingly, the at least one characteristic parameter is determined based on a broader set of data, and the quality of the performance analysis by the artificial intelligence module is enhanced.

The artificial intelligence module may be a machine learning module that is trained to determine the at least one characteristic quantity, for example wherein the artificial intelligence module comprises an artificial neural network. In other words, the artificial intelligence module is trained to determine the at least one characteristic parameter by a suitable machine learning technique, for example by a suitable deep learning technique.

According to an aspect of the present disclosure, training data is provided, wherein the training data comprises at least one reference characteristic quantity of the reference device under test and/or a training input signal that is associated with a reference device under test having known performance properties, and wherein the at least one computing parameter is adapted based on the training data. In other words, labelled and/or unlabelled training data is provided, wherein the training data at least comprises a training input signal that is associated with a reference device under test having known performance properties. If the training data is labelled, the training data may also comprise a reference characteristic quantity of the reference device under test.

According to another aspect of the present disclosure, the at least one computing parameter is adapted via supervised learning, unsupervised learning and/or reinforcement learning. Thus, at least parts of the training may be performed based on feedback given by an expert in the field. Alternatively or additionally, the training may be performed fully automatic.

The digitized signal may be a time domain signal, for example wherein the digitized signal has a predefined duration. The digitized signal may also be a frequency domain signal, for example wherein the digitized signal has a predefined bandwidth. The at least one computing parameter may be adapted based on the predefined duration and/or based on the predefined bandwidth.

Embodiments of the present disclosure further provide a test system for analyzing a performance of a device under test. In an embodiment, the test system comprises a data acquisition unit having one or more circuits configured to obtain a digitized input signal. The test unit further comprises an artificial intelligence circuit or module comprising at least one computing parameter, and a control unit composed, for example, of one or more circuits. The control unit is configured to cause the test system to perform the signal analysis method described above.

Regarding the advantages and further properties of the test system, reference is made to the explanations given above regarding the signal analysis, which also hold for the test system and vice versa.

In some embodiments, the test system comprises the device under test.

In an embodiment of the present disclosure, the test system comprises a power supply unit, wherein the power supply unit includes one or more circuits configured to provide the device under test with power. The power supply unit is configured to provide usage information on a power consumption of the device under test, a current consumption of the device under test and/or a voltage applied to the device under test. Thus, additional information on performance properties of the device under test are provided and may be utilized by the artificial intelligence module.

According to a further embodiment of the present disclosure, the artificial intelligence module is established as software running on a computing device having one or more computer circuits, processing circuits, etc. For example, the computing device may be established as at least one computer, at least one laptop, at least one server, at least one smartphone, at least one tablet and/or at least one other type of smart device. In some embodiments, the computing device established by several computers and/or servers that form a cloud computing setup.

Embodiments of the present disclosure further provide a computer program comprising program code means, instructions, scripts, etc., being adapted to cause a test system, for example the test system described above, to perform the signal analysis method described above when the computer program is executed on a processing unit, such as a processer circuit, of a control unit of the test system.

Therein and in the following, the term "program code means" is understood to comprise computer-executable instructions in the form of program code and/or program code modules, in compiled and/or uncompiled form. The program code means may be provided in an arbitrary programming language and/or in machine language.

Regarding the further advantages and properties of the computer program or program instructions, reference is made to the explanations given above regarding the signal analysis method and regarding the test system, which also hold for the computer program or instructions and vice versa.

DESCRIPTION OF THE DRAWINGS

The foregoing aspects and many of the attendant advantages of the claimed subject matter will become more readily appreciated as the same become better understood by reference to the following detailed description, when taken in conjunction with the accompanying drawings, wherein:

DETAILED DESCRIPTION

The detailed description set forth below in connection with the appended drawings, where like numerals reference like elements, is intended as a description of various embodiments of the disclosed subject matter and is not intended to represent the only embodiments. Each embodiment described in this disclosure is provided merely as an example or illustration and should not be construed as preferred or advantageous over other embodiments. The illustrative examples provided herein are not intended to be exhaustive or to limit the claimed subject matter to the precise forms disclosed.

Figure 1:
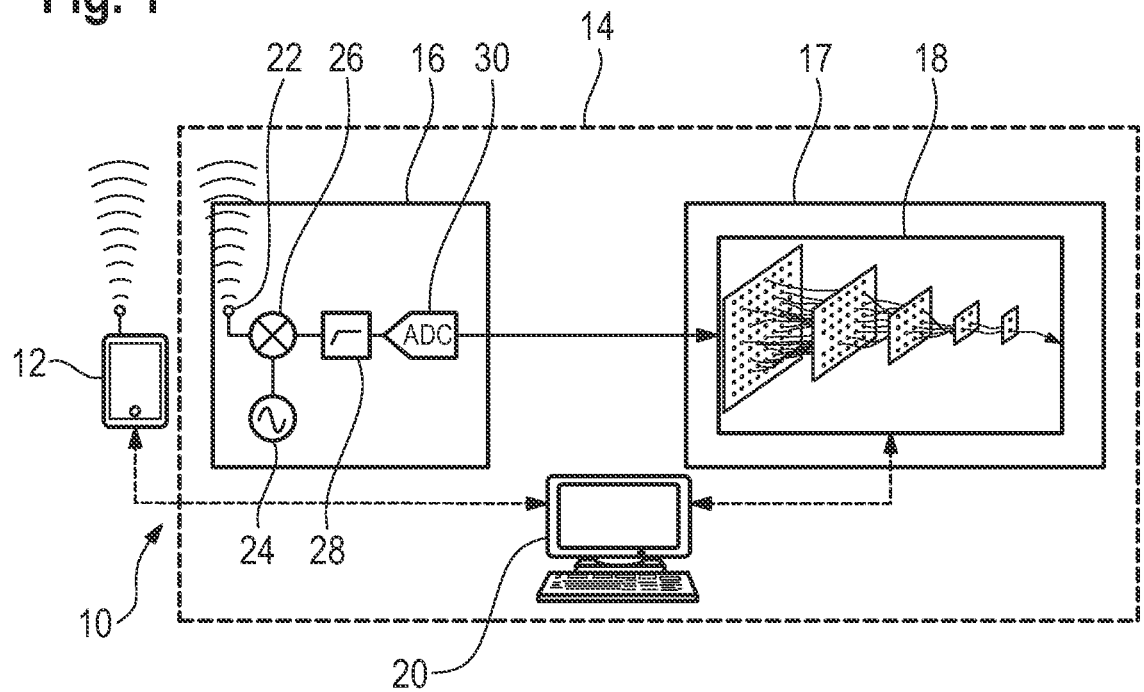
FIG. 1 schematically shows a test system according to a first embodiment of the present disclosure.

FIG. 1 schematically shows a test system 10 comprising a device under test 12 and a testing assembly 14. The testing assembly 14 comprises a data acquisition unit 16, a computing device 17 with an artificial intelligence module 18, and a control unit 20. One or more of the components of the testing assembly 14 includes circuitry (one or more circuits) configured for carrying out the methodologies or technologies described herein.

In the embodiment shown, the device under test 12 is a radio frequency (RF) device that is used for wireless transmission of information and data. In some embodiments, the device under test 12 is a mobile communication device, for example a mobile, a tablet or a smartphone.

However, it is to be understood that the explanations given in the following with regard to analyzing a signal generated by the device under test 12 also apply to any kind of device under test 12 that generates an electromagnetic signal that can be received and analyzed, be it by wireless transmission or by wire-based transmission of the electromagnetic signal.

The data acquisition unit 16, the computing device 17 with the artificial intelligence module 18, and/or the control unit 20 may be integrated into a common measurement device, for example into an oscilloscope, a vector network analyzer etc. Hence, a housing may be provided that encompasses the respective components. Alternatively, one or more of the data acquisition unit 16, the computing device 17, and/or the control unit 20 may be established separately, for example self-contained.

As shown in FIG. 1, the data acquisition unit 16 comprises an antenna 22, a local oscillator 24, a mixer 26, a filter 28, and an analog to digital converter (ADC) 30.

The computing device 17 may be established as at least one computer, at least one laptop, at least one server, at least one smartphone, at least one tablet and/or at least one other type of smart device. In some embodiments, the computing device 17 may be established via a cloud computing setup. In other words, the at least one computer includes one or more computer circuits for processing software, such as program code, instructions, scripts, or the like.

The artificial intelligence module 18 is established, for example, as a software module having software (e.g., program code, instructions, scripts, etc.), saved on a data memory (not shown) of the computing device 17, and that can be executed on a processing unit of the computing device 17, for example on a central processing unit (CPU) and/or on a graphics processing unit (GPU) of the computing device 17. In an embodiment, the artificial intelligence module 18 is a machine learning module. In some embodiments, the artificial intelligence module 18 comprises an artificial neural network.

The control unit 20 may be established as a computer, a laptop, a server, a smart phone, a tablet and/or as any other type of smart device. In other words, the at least one computer includes one or more control circuits.

The control unit 20 is connected to each of the data acquisition unit 16 and to the computing device 17, and thus also to the artificial intelligence module 18 in a signal transmitting manner. The computing device 17, and thus also the artificial intelligence module 18, is connected to the data acquisition unit 16 downstream of the data acquisition unit 16 in a signal transmitting manner.

Therein and in the following, the terms "downstream" and "upstream" are used to indicate the flow directions of data, signals and/or information within the test system 10, wherein the flow direction is from the upstream component to the downstream component.

Figure 2:
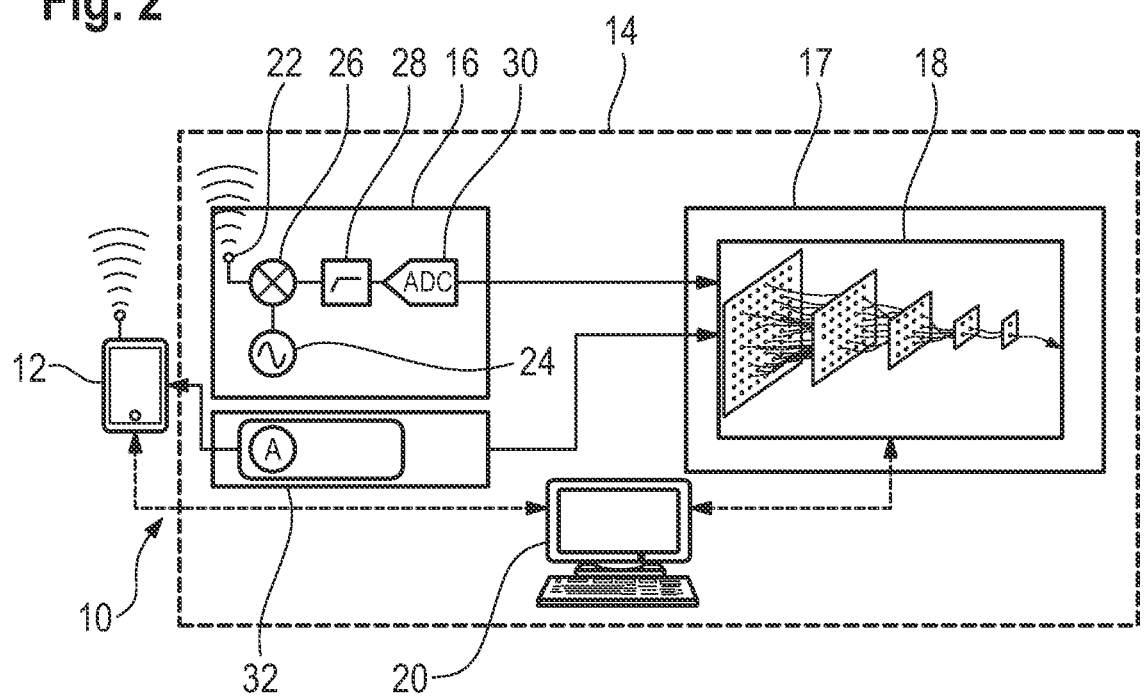
FIG. 2 schematically shows a test system according to a second embodiment of the present disclosure.

FIG. 2 shows a second embodiment of the test system 10, wherein the only difference to the embodiment shown in FIG. 1 is that an additional power supply unit 32 is provided. The power supply unit 32 includes one or more circuits configured to supply the device under test 12 with power. The power supply unit 32 is connected to the computing device 17, and thus to the artificial intelligence module 18 in a signal transmitting manner.

Generally speaking, both the first and the second embodiments of the test system 10 described above are configured to perform a signal analysis method for analyzing a performance of the device under test 12. This signal analysis method will be described in the following with reference to FIG. 3.

In some embodiments, a computer program is executed on the control unit 20, for example on a processing unit of the control unit 20, wherein the computer program comprises program code means that are adapted to cause the test system 10 to perform the signal analysis method described below.

The control unit 20 controls the device under test 12 to enter a predetermined operation mode and/or a sequence of predetermined operation modes (step S1).

Therein, the predetermined operation mode corresponds to the sending mode of the device under test 12. In other words, the device under test 12 generates an electromagnetic signal in a predetermined way in the predetermined operation mode or in the sequence of predetermined operation modes.

The predetermined operation mode or rather the sequence of predetermined operation modes may be associated with a predefined test procedure that is suitable for the particular device under test 12. The predefined test procedure may be a normed test procedure.

In the example of FIGS. 1 and 2, the device under test 12 generates the electromagnetic signals in the form of electromagnetic waves radiated over the air. However, as already mentioned above, the electromagnetic signal may, depending on the type of the device under test 12, also be generated and transmitted via a wire-based connection.

The electromagnetic signals generated by the device under test 12 are then received and digitized by the data acquisition unit 16, thereby obtaining a digitized input signal (step S2), wherein the digitized input signal may be associated with time domain or with frequency domain.

The electromagnetic waves generated by the device under test 12 are received via the antenna 22 and are mixed down via the mixer 26 based on an oscillator signal from the local oscillator 24. The down-mixed signal is then filtered via the filter 28 and digitized by the analog to digital converter 30. The data acquisition unit 16 may comprise a memory for storing the digitized input signal.

The digitized input signal is then forwarded to the computing device 17, and thus also to the artificial intelligence module 18. The computing device 17 may comprise a memory for storing the digitized input signal, for example a buffer memory.

In the embodiment of FIG. 2, the power supply unit 32 includes circuitry configured to generate usage information. In some embodiments, the usage information comprises information on a power consumption of the device under test 12, the current consumption of the device under test 12 and/or a voltage applied to the device under test 12. A signal containing this usage information may be forwarded to the artificial intelligence module 18.

The artificial intelligence module 18 determines at least one characteristic quantity based on at least one computing parameter of the artificial intelligence module 18, based on the digitized input signal and, optionally, based on the usage information (step S3).

Therein, the term "computing parameter" is a collective term representing computational parameters that are employed by the artificial intelligence module 18 in order to determine the at least one characteristic quantity. In the case of the artificial intelligence module 18 comprising the artificial neural network, the at least one computing parameter comprises weighting factors of the individual neurons of the artificial neural network.

The at least one characteristic quantity is indicative of one or several performance properties of the device under test 12. For example, the at least one characteristic quantity may comprise information on certain aspects of the performance of the device under test 12 and/or about particular faults and errors in the performance of the device under test 12.

Therein, the at least one characteristic quantity may have any suitable form, for example it may comprise a scalar, a vector, a matrix and/or a tensor.

For example, the at least one characteristic quantity may comprise information on beamforming properties, a responsiveness, a power consumption, a current consumption, an effectiveness, and/or any other property of the device under test 12 that is suitable for assessing the performance of the device under test 12.

Generally speaking, the artificial intelligence module 18, for example the artificial neural network, is trained to determine the characteristic quantity based on digitized input signal and, optionally, based on the usage information. The training of the artificial intelligence module 18 may be done in any suitable fashion, i.e. with any suitable machine learning technique. The training procedure may comprise supervised learning, unsupervised learning and/or reinforcement learning.

For example, labelled and/or unlabelled training data is provided, wherein the training data at least comprises a training input signal that is associated with a reference device under test having known performance properties. Additionally, if the training data is labelled, the training data may also comprise a reference characteristic quantity of the reference device under test.

The reference characteristic quantity may be obtained by a (onetime) analysis of the performance of the reference device under test by a skilled operator using a test system known from the state-of-the-art.

In order to train the artificial intelligence module 18, the provided training data is processed via the artificial intelligence module 18, such that a provisional characteristic quantity is obtained. The provisional characteristic quantity may then be compared to the reference characteristic quantity and/or may be checked by a human operator.

Based on the comparison and or/based on the analysis by the human operator, feedback is given to the artificial intelligence module and the at least one computing parameter is adapted via suitable machine learning techniques.

Based on the at least one characteristic quantity determined, the device under test 12 is categorized into at least one of at least two different performance categories (step S4), for example by the artificial intelligence module 18.

For example, the device under test 12 may be categorized into the category "test passed" or "test not passed". Of course, there may be more different categories, for example categories associated with particular errors or defects in the performance of the device under test 12.

Figure 3:
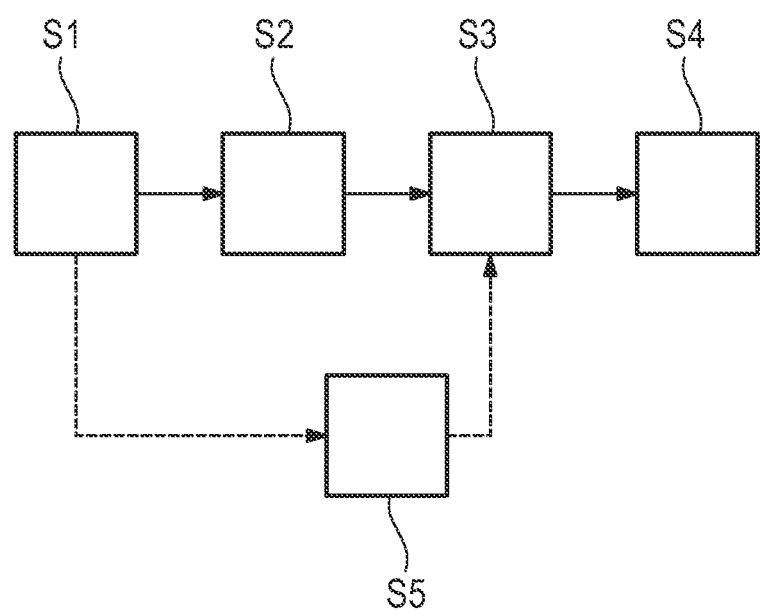
FIG. 3 shows a block diagram of a signal analysis method according to an embodiment of the present disclosure.

As is indicated by the dashed arrows in FIG. 3, the control unit 20 may also control the artificial intelligence module 18 to adapt the at least one computing parameter based on the predetermined operation mode of the device under test 12 and/or the predetermined sequence of operation modes of the device under test 12.

In other words, the at least one computing parameter may be adapted to suit the particular operation mode of the device under test 12 or the particular sequence of operation modes of the device under test 12.

Accordingly, several sets of computing parameters may be stored in the computing device 17 and/or in the artificial intelligence module 18, wherein each set of computing parameters may be associated with one or more particular operation modes of the device under test 12.

Summarizing, the test system 10 and the signal analysis methods described above provide an easy way of testing the device under test 12, because all relevant evaluations are automatically performed by the artificial intelligence module 18 and do not require substantive knowledge in the field.

Certain embodiments disclosed herein utilize circuitry (e.g., one or more circuits), for example the respective modules, units, etc., in order to implement protocols, methodologies or technologies disclosed herein, operably couple two or more components, generate information, process information, analyze information, generate signals, encode/decode signals, convert signals, transmit and/or receive signals, control other devices, etc. Circuitry of any type can be used. It will be appreciated that the term "information" can be use synonymously with the term "signals" in this paragraph. It will be further appreciated that the terms "circuitry," "circuit," "one or more circuits," etc., can be used synonymously herein.

In an embodiment, circuitry includes, among other things, one or more computing devices such as a processor (e.g., a microprocessor), a central processing unit (CPU), a digital signal processor (DSP), an application-specific integrated circuit (ASIC), a field-programmable gate array (FPGA), a system on a chip (SoC), or the like, or any combinations thereof, and can include discrete digital or analog circuit elements or electronics, or combinations thereof.

In an embodiment, circuitry includes hardware circuit implementations (e.g., implementations in analog circuitry, implementations in digital circuitry, and the like, and combinations thereof). In an embodiment, circuitry includes combinations of circuits and computer program products having software or firmware instructions stored on one or more computer readable memories that work together to cause a device to perform one or more protocols, methodologies or technologies described herein. In an embodiment, circuitry includes circuits, such as, for example, microprocessors or portions of microprocessor, that require software, firmware, and the like for operation. In an embodiment, circuitry includes an implementation comprising one or more processors or portions thereof and accompanying software, firmware, hardware, and the like. In some embodiments, the functionality described herein can be implemented by special purpose hardware-based computer systems or circuits, etc., or combinations of special purpose hardware and computer instructions.

Various embodiments of the present disclosure or the functionality thereof may be implemented in various ways, including as non-transitory computer programs or program products. A computer program product may include a non-transitory computer-readable storage medium storing applications, programs, program modules, scripts, source code, program code, object code, byte code, compiled code, interpreted code, machine code, executable instructions, and/or the like (also referred to herein as executable instructions, instructions for execution, program code, computer program instructions, and/or similar terms used herein interchangeably). Such non-transitory computer-readable storage media include all computer-readable media (including volatile and non-volatile media).

Embodiments of the present disclosure may also take the form of an apparatus, system, computing device, computing entity, and/or the like executing instructions stored on computer-readable storage media to perform certain steps or operations, such as one or more steps of the method of FIG. 3. The computer-readable media include cooperating or interconnected computer-readable media, which exist exclusively on a processing or processor system or distributed among multiple interconnected processing or processor systems that may be local to, or remote from, the processing or processor system. However, embodiments of the present disclosure may also take the form of an entirely hardware embodiment performing certain steps or operations.

Various embodiments are described above with reference to block diagrams and/or flowchart illustrations of apparatuses, methods, systems, and/or computer program instructions or program products. It should be understood that each block of any of the block diagrams and/or flowchart illustrations, respectively, of portions thereof, may be implemented in part by computer program instructions, e.g., as logical steps or operations executing on one or more computing devices. These computer program instructions may be loaded onto one or more computers or computing devices, such as special purpose computer(s) or computing device(s) or other programmable data processing apparatus(es) to produce a specifically-configured machine, such that the instructions which execute on one or more computers or computing devices or other programmable data processing apparatus implement the functions specified in the flowchart block or blocks and/or carry out the methods described herein.

These computer program instructions may also be stored in one or more computer-readable memory or portions thereof, such as the computer-readable storage media described above, that can direct one or more computers or computing devices or other programmable data processing apparatus(es) to function in a particular manner, such that the instructions stored in the computer-readable memory produce an article of manufacture including computer-readable instructions for implementing the functionality specified in the flowchart block or blocks.

The computer program instructions may also be loaded onto one or more computers or computing devices or other programmable data processing apparatus(es) to cause a series of operational steps to be performed on the one or more computers or computing devices or other programmable data processing apparatus(es) to produce a computer-implemented process such that the instructions that execute on the one or more computers or computing devices or other programmable data processing apparatus(es) provide operations for implementing the functions specified in the flowchart block or blocks and/or carry out the methods described herein.

It will be appreciated that the term computer or computing device can include, for example, any computing device or processing structure, including but not limited to a processor (e.g., a microprocessor), a central processing unit (CPU), a digital signal processor (DSP), an application-specific integrated circuit (ASIC), a field-programmable gate array (FPGA), a system on a chip (SoC), or the like, or any combinations thereof.

Accordingly, blocks of the block diagrams and/or flowchart illustrations support various combinations for performing the specified functions, combinations of operations for performing the specified functions and program instructions for performing the specified functions. Again, it should also be understood that each block of the block diagrams and flowchart illustrations, and combinations of blocks in the block diagrams and/or flowchart illustrations, or portions thereof, could be implemented by special purpose hardware-based computer systems or circuits, etc., that perform the specified functions or operations, or combinations of special purpose hardware and computer instructions.

According to some embodiments, one or more individual steps of a process may or may not be carried out utilizing computer or computing based systems described herein, and the degree of computer implementation may vary, as may be desirable and/or beneficial for one or more particular applications.

The present application may reference quantities and numbers. Unless specifically stated, such quantities and numbers are not to be considered restrictive, but exemplary of the possible quantities or numbers associated with the present application. Also in this regard, the present application may use the term "plurality" to reference a quantity or number. In this regard, the term "plurality" is meant to be any number that is more than one, for example, two, three, four, five, etc. The terms "about," "approximately," "near," etc., mean plus or minus 5% of the stated value. For the purposes of the present disclosure, the phrase "at least one of A and B" is equivalent to "A and/or B" or vice versa, namely "A" alone, "B" alone or "A and B.". Similarly, the phrase "at least one of A, B, and C," for example, means (A), (B), (C), (A and B), (A and C), (B and C), or (A, B, and C), including all further possible permutations when greater than three elements are listed.

The principles, representative embodiments, and modes of operation of the present disclosure have been described in the foregoing description. However, aspects of the present disclosure which are intended to be protected are not to be construed as limited to the particular embodiments disclosed. Further, the embodiments described herein are to be regarded as illustrative rather than restrictive. It will be appreciated that variations and changes may be made by others, and equivalents employed, without departing from the spirit of the present disclosure. Accordingly, it is expressly intended that all such variations, changes, and equivalents fall within the spirit and scope of the present disclosure, as claimed.

The embodiments of the invention in which an exclusive property or privilege is claimed are defined as follows:

1. A signal analysis method of analyzing a performance of a device under test, the method comprising:
    obtaining a digitized input signal, wherein the digitized input signal is associated with the device under test, and
    determining at least one characteristic quantity via an artificial intelligence circuit, wherein the artificial intelligence circuit comprises at least one computing parameter, and wherein the at least one characteristic quantity is determined based on the digitized input signal and based on the at least one computing parameter,
    wherein the at least one characteristic quantity is indicative of at least one performance property of the device under test.

2. The signal analysis method of claim 1, wherein the device under test is categorized into at least one of at least two different performance categories based on the at least one characteristic quantity determined.

3. The signal analysis method according to claim 1, wherein a control unit is provided, wherein the control unit includes one or more circuits configured to control the device under test to enter at least one of a predetermined operation mode and a sequence of predetermined operation modes.

4. The signal analysis method according to claim 3, wherein the control unit is configured to control the artificial intelligence circuit to adapt the at least one computing parameter based on the predetermined operation mode of the device under test.

5. The signal analysis method according to claim 1, wherein a power supply unit is provided, wherein the power supply unit provides the device under test with power, wherein the power supply unit provides usage information on at least one of a power consumption of the device under test, a current consumption of the device under test, and a voltage applied to the device under test, and wherein the usage information is forwarded to the artificial intelligence circuit.

6. The signal analysis method according to claim 5, wherein the artificial intelligence circuit determines the at least one characteristic parameter based on the usage information.

7. The signal analysis method according to claim 1, wherein the artificial intelligence circuit is a machine learning circuit that is trained to determine the at least one characteristic quantity.

8. The signal analysis method of claim 7, wherein the artificial intelligence circuit comprises an artificial neural network.

9. The signal analysis method according to claim 1, wherein training data is provided, wherein the training data comprises at least one reference characteristic quantity of the reference device under test and/or a training input signal that is associated with a reference device under test having known performance properties, and wherein the at least one computing parameter is adapted based on the training data.

10. The signal analysis method of claim 9, wherein the at least one computing parameter is adapted via at least one of supervised learning, unsupervised learning, and reinforcement learning.

11. The signal analysis method according to claim 1, wherein the digitized signal is a time domain signal.

12. The signal analysis method of claim 11, wherein the digitized signal has a predefined duration.

13. The signal analysis method of claim 1, wherein the digitized signal is a frequency domain signal.

14. The signal analysis method of claim 13, wherein the digitized signal has a predefined bandwidth.

15. A test system for analyzing a performance of a device under test, the test system comprising:
a data acquisition unit configured to obtain a digitized input signal;
an artificial intelligence circuit comprising at least one computing parameter; and
a control unit including one or more circuits configured to cause the test system:
obtain a digitized input signal, wherein the digitized input signal is associated with the device under test, and
determine at least one characteristic quantity via the artificial intelligence circuit, wherein the at least one characteristic quantity is determined based on the digitized input signal and based on the at least one computing parameter,
wherein the at least one characteristic quantity is indicative of at least one performance property of the device under test.

16. The test system of claim 15, further comprising the device under test.

17. The test system of claim 16, further comprising a power supply unit, wherein the power supply unit is configured to provide the device under test with power, and wherein the power supply unit is configured to provide usage information on at least one of a power consumption of the device under test, a current consumption of the device under test, and a voltage applied to the device under test.

18. The test system according to claim 15, wherein the artificial intelligence circuit includes program code means to be executed by a computing device.

19. A computer readable media having program code means stored therein, the program code means when executed by a test system perform a signal analysis according to the following steps:
obtaining a digitized input signal, wherein the digitized input signal is associated with the device under test, and
determining at least one characteristic quantity via an artificial intelligence circuit, wherein the artificial intelligence circuit comprises at least one computing parameter, and wherein the at least one characteristic quantity is determined based on the digitized input signal and based on the at least one computing parameter,
wherein the at least one characteristic quantity is indicative of at least one performance property of the device under test.

* * * * *